US012733191B2

(12) United States Patent
Iucolano et al.

(10) Patent No.: US 12,733,191 B2
(45) Date of Patent: Sep. 8, 2026

(54) MANUFACTURING PROCESS OF AN OHMIC CONTACT OF A HEMT DEVICE AND HEMT DEVICE

(71) Applicant: STMICROELECTRONICS S.r.l., Agrate Brianza (IT)

(72) Inventors: Ferdinando Iucolano, Gravina di Catania (IT); Giuseppe Greco, Misterbianco (IT); Paolo Badala', Acireale (IT); Fabrizio Roccaforte, Mascalucia (IT); Monia Spera, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 429 days.

(21) Appl. No.: 18/156,976

(22) Filed: Jan. 19, 2023

(65) Prior Publication Data

US 2023/0246088 A1 Aug. 3, 2023

(30) Foreign Application Priority Data

Feb. 1, 2022 (IT) ........................ 102022000001700

(51) Int. Cl.
*H10D 30/47* (2025.01)
*H10D 30/01* (2025.01)

(52) U.S. Cl.
CPC ......... *H10D 30/015* (2025.01); *H10D 30/475* (2025.01)

(58) Field of Classification Search
CPC ........... H01L 21/02255; H01L 21/2636; H01L 21/28176; H01L 21/28185; H01L 21/3225;

(Continued)

(56) References Cited

U.S. PATENT DOCUMENTS

2011/0147798 A1 6/2011 Radosavljevic et al.
2011/0287626 A1* 11/2011 Seki ....................... H10D 64/62 257/E21.159

(Continued)

FOREIGN PATENT DOCUMENTS

CN 110349839 A 10/2019
CN 111243949 A 6/2020

(Continued)

OTHER PUBLICATIONS

C. Arvieu, J.P. Manaud, J.M. Quenisset, Interaction between titanium and carbon at moderate temperatures, Journal of Alloys and Compounds, vol. 368, Issues 1-2,2004,pp. 116-122,ISSN 0925-8388,https://doi.org/10.1016/j.jallcom.2003.08.051. (Year: 2004).*

(Continued)

*Primary Examiner* — Matthew C Landau
*Assistant Examiner* — Nora T. Nix
(74) *Attorney, Agent, or Firm* — Seed Intellectual Property Law Group LLP

(57) ABSTRACT

A process for manufacturing a HEMT device includes forming a conductive region on a work body having a semiconductive heterostructure. To obtain the conductive region, a first reaction region having carbon is formed on the heterostructure and a metal stack is formed having a second reaction region in contact with the first reaction region. The work body is annealed, so that the first reaction region reacts with the second reaction region, thus forming an interface portion of the conductive region. The interface portion is of a compound having carbon and is in ohmic contact with the semiconductive hetero structure.

20 Claims, 10 Drawing Sheets

(58) Field of Classification Search

CPC ....... H01L 21/324–3247; H01L 21/477; H01L 21/76828; H01L 21/76864; H01L 2021/60105–60165; H01L 21/043; H01L 21/0485; H01L 21/0272; H01L 21/0331; H01L 21/7813; H01L 2224/0347–0348; H01L 2224/1147–1148; H01L 2224/2747–2748; H01L 21/7681; H01L 21/76811; H10D 48/074; H10D 64/62; H10D 30/47–485; H10D 30/015; H10F 39/028; H10F 71/128; H10F 71/131; H10H 20/016–0165; H10K 71/40–441; H10K 10/84; H10K 71/221

See application file for complete search history.

(56) References Cited

U.S. PATENT DOCUMENTS

| | | | |
|---|---|---|---|
| 2019/0115449 A1* | 4/2019 | Nakano | H10D 30/015 |
| 2020/0135478 A1 | 4/2020 | Passlack et al. | |

FOREIGN PATENT DOCUMENTS

| | | | |
|---|---|---|---|
| EP | 2485250 | A1 | 8/2012 |
| EP | 3660923 | A1 | 6/2020 |
| IT | UB20155503 | A1 | 5/2017 |
| JP | H05315595 | A | 11/1993 |
| JP | 2001044139 | A | 2/2001 |

OTHER PUBLICATIONS

Maeda M, Matsumoto N and Takahashi Y 2010 Materials Science and Technology (MS&T'10) Conf. Proc. CD-ROM (Houston, TX, Oct. 17-21, 2010) (Warrendale, PA: The Minerals, Metals & Materials Society) pp. 2732-2742 (Year: 2010).*

Maeda et al., "Formation of Ohmic Contact Layer on n-type Gallium Nitride by Controlling Interfacial Reaction with Titanium," Materials Science and Technology (MS&T), Oct. 17-21, 2010, Houston, Texas, Joining of Advanced and Specialty Materials XII, pp. 2732-2742.

Vertiatchikh et al., "Structural properties of alloyed Ti/Al/Ti/Au and Ti/Al/Mo/Au ohmic contacts to AlGaN/GaN," Solid-State Electronics 50(7):1425-1429, 2006.

* cited by examiner

MANUFACTURING PROCESS OF AN OHMIC CONTACT OF A HEMT DEVICE AND HEMT DEVICE

CROSS REFERENCE TO RELATED APPLICATION

This application claims the priority benefit of Italian patent application number 102022000001700, filed on Feb. 1, 2022, which is hereby incorporated by reference to the maximum extent allowable by law.

BACKGROUND

Technical Field

The present disclosure relates to a manufacturing process of an ohmic contact of a high electron mobility transistor (HEMT) device and to a HEMT device.

Description of the Related Art

HEMT devices are known wherein a conductive channel is based on the formation of layers of two-dimensional electron gas (2DEG) having high mobility at a heterojunction, that is at the interface between semiconductor materials having different band gap. For example, HEMT devices based on the heterojunction between an aluminum gallium nitride (AlGaN) layer and a gallium nitride (GaN) layer are known.

The HEMT devices based on AlGaN/GaN heterojunctions or heterostructures offer several advantages that make them particularly suitable and widely used for different applications. For example, the high breakdown threshold of HEMT devices is exploited for high-performance power switches; the high mobility of the electrons in the conductive channel allows high-frequency amplifiers to be provided; in addition, the high concentration of electrons in the 2DEG allows a low ON-state resistance (RoN) to be obtained.

Moreover, the HEMT devices for radio frequency (RF) applications typically have better RF performances with respect to similar silicon LDMOS devices.

A known HEMT device is formed in a semiconductor body including a substrate and a heterostructure, and includes source and drain regions, in ohmic contact with the heterostructure.

Generally, the source and drain regions are made with metallizations including gold, which allows low contact and access resistances to be achieved.

However, the manufacturing process of ohmic contacts including gold calls for an annealing at high temperatures, even higher than 800° C. Such high temperatures may cause mechanical stability problems and electrical malfunctions in HEMT devices.

Moreover, the formation of an ohmic contact with gold is not easily implementable in a CMOS line due to the metal contamination generated by gold, which would call for dedicated equipment and segregated production areas.

According to an alternative approach, ohmic contacts are made without gold, from a stack of metal layers including a titanium layer, in contact with the heterostructure surface, and an aluminum layer extending on the titanium layer.

This alternative approach allows the temperature of the annealing to be reduced to 600° C. However, this temperature reduction may not be sufficient in specific applications. In detail, the ohmic contacts of the known HEMT devices made without gold have a high surface roughness, for example having a root mean square (RMS) value of 100 nm measured with an atomic force microscope (AFM), which may cause malfunctions and breakdowns of the HEMT devices.

Moreover, the contact and access resistance of the ohmic contacts is not sufficiently low in specific applications.

BRIEF SUMMARY

In one embodiment, a manufacturing process of an HEMT device includes forming, from a work body including a semiconductive heterostructure, a conductive region having an interface portion in ohmic contact with the semiconductive heterostructure. Forming the conductive region includes forming a first reaction region including carbon on the semiconductive heterostructure and forming a metal stack including a second reaction region extending in contact with the first reaction region. Forming the conductive region includes forming the first interface portion of the conductive region by reacting the first reaction region with the second reaction region by annealing the work body. The interface portion is of a compound including carbon.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
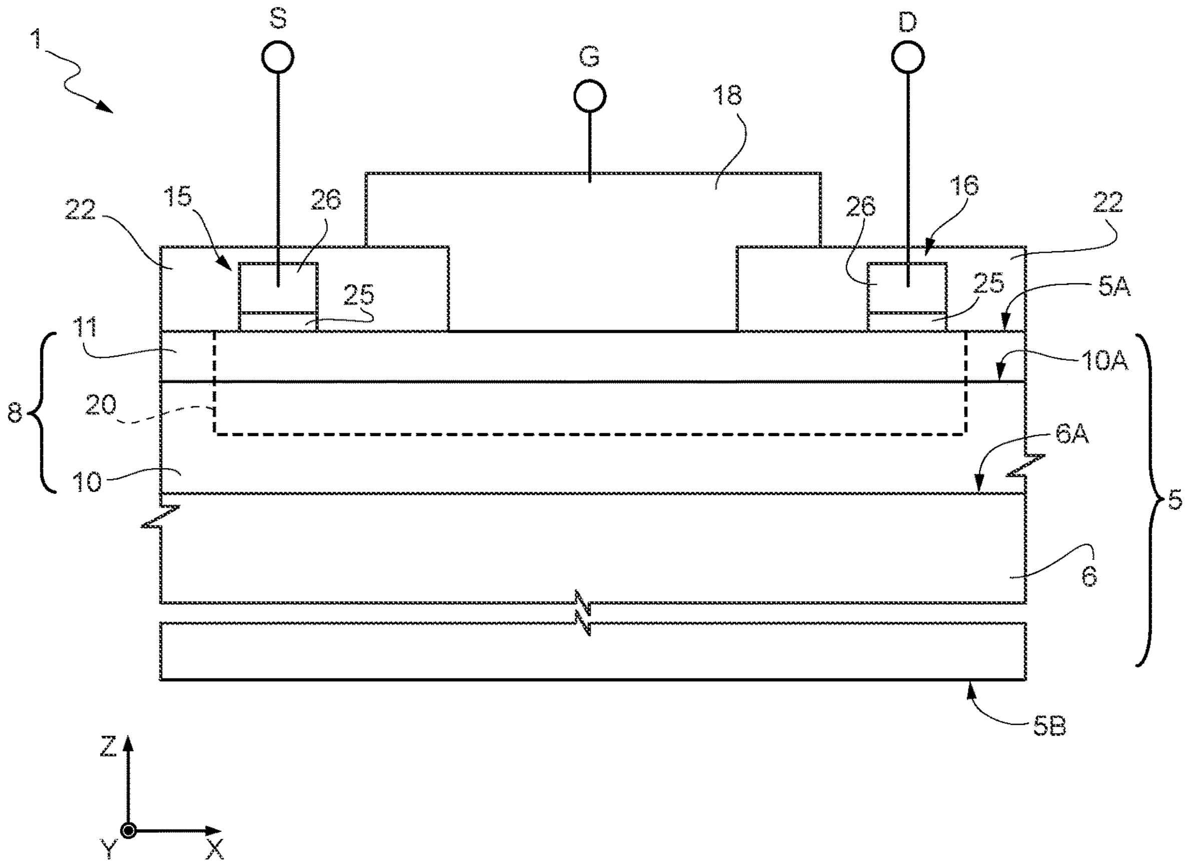
FIG. 1 shows a cross-section of the present HEMT device, according to an embodiment.

FIG. 1 shows a HEMT device 1 in a Cartesian reference system XYZ including a first axis X, a second axis Y and a third axis Z.

The HEMT device 1 is of normally-on type. However, alternatively, the HEMT device 1 may be of normally-off type.

The HEMT device 1 is formed in a body 5 having a first surface 5A and a second surface 5B and including a substrate 6 and a heterostructure 8 extending above the substrate 6.

The substrate 6, of semiconductor material, for example silicon or silicon carbide, or of other materials such as sapphire ($Al_2O_3$), extends between the second surface 5B of the body 5 and a respective surface 6A.

The heterostructure 8 includes compound semiconductor materials including elements of the group III-V, extends on the surface 6A of the substrate 6 and forms the first surface 5A of the body 5.

The heterostructure 8 is formed by a channel layer 10 of a first semiconductor material, for example gallium nitride (GaN) or an alloy including gallium nitride such as InGaN, here of intrinsic gallium nitride (GaN), extending on the substrate 6 and having a surface 10A, and by a barrier layer 11 of a second semiconductor material, for example a compound based on a ternary or quaternary alloy of gallium nitride, such as $Al_xGa_{1-x}N$, AlInGaN, $In_xGa_{1-x}N$, $Al_xIn_{1-x}Al$, AlScN, here of intrinsic aluminum gallium nitride (AlGaN), extending between the surface 10A of the channel layer 10 and the first surface 5A of the body 5.

The channel layer 10 has a thickness, along the third axis Z, for example between about 1 μm and 5 μm; the barrier layer 11 has a thickness, along the third axis Z, for example between about 5 nm and 30 nm.

The heterostructure 8 accommodates an active region 20, indicated by a dashed line in FIG. 1, which accommodates, in use, a conductive channel of the HEMT device 1. The conductive channel is based on the formation of layers of two-dimensional gas (2DEG) due to the difference in band-gap between the channel layer 10 and the barrier layer 11 and formed by high mobility charge carriers, for example electrons.

The HEMT device 1 includes a source region 15 and a drain region 16 extending in direct electrical contact with the heterostructure 8; and a gate region 18 extending, parallel to the first axis X, between the source region 15 and the drain region 16, in direct electrical contact with the heterostructure 8.

The HEMT device 1 further includes an insulation or passivation layer 22, of dielectric material such as for example silicon nitride or silicon oxide, extending on the first surface 5A of the body 5.

In this embodiment, the insulation layer 22 covers the source region 15 and the drain region 16.

The gate region 18 may be formed by a single conductive layer or by a stack of layers, for example a stack of conductive layers or a stack of conductive and insulating layers, and is suitable for forming a Schottky-type contact with the heterostructure 8, in particular here with the barrier layer 11.

The gate region 18 forms a gate electrode G of the HEMT device 1.

The gate region 18 is laterally separated, along the first axis X, from the source region 15 and from the drain region 16 by respective portions of the insulation layer 22.

In detail, the gate region 18 extends through the insulation layer 22, throughout the thickness along the third axis Z of the insulation layer 22, up to the first surface 5A of the body 5.

However, according to other embodiments not shown here, the gate region 18 may include a portion extending in depth into the heterostructure 8.

The source region 15 and the drain region 16 are in ohmic contact with the heterostructure 8.

In practice, the source region 15 and the drain region 16 form, respectively, a source electrode S and a drain electrode D of the HEMT device 1.

In this embodiment, the source region 15 and the drain region 16 are equal to each other; consequently, hereinafter, reference will be made for simplicity to the source region 15 only and what has been described for the source region 15 also applies to the drain region 16, unless otherwise specified.

However, it will be clear to the person skilled in the art that the source region 15 and the drain region 16 may be different from each other, for example formed of different materials or have different shapes and dimensions, according to the specific application.

Figure 2:
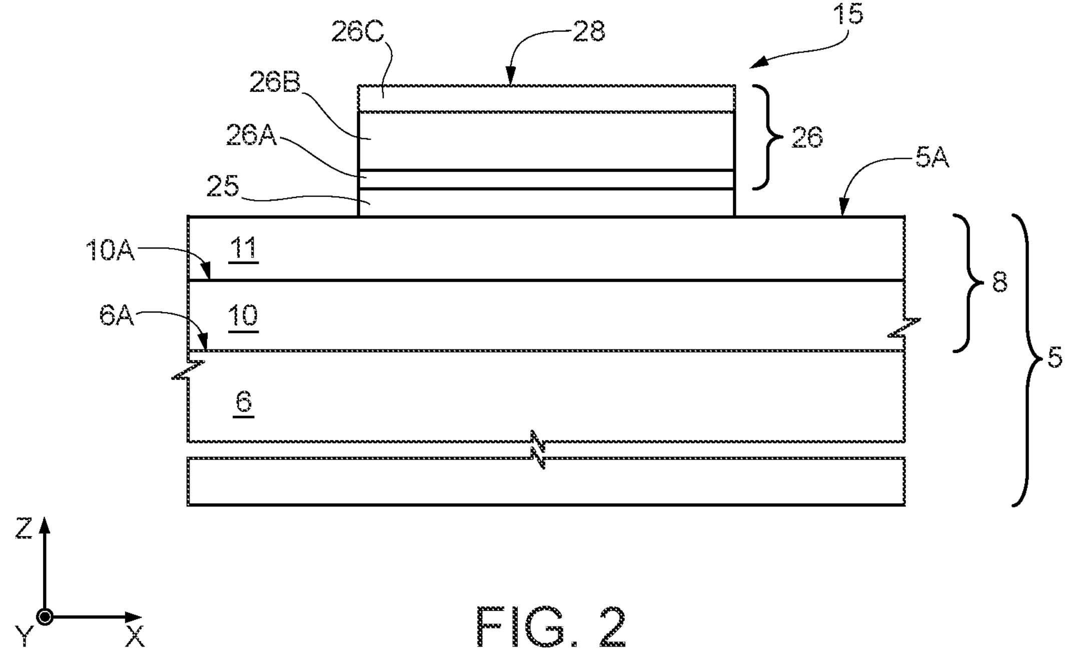
FIG. 2 shows a cross-section of a portion of the HEMT device of FIG. 1, according to an embodiment.

The source region 15, shown in detail in FIG. 2, has a top surface 28 and is formed by an interface portion 25, extending in direct contact with the heterostructure 8, and a central body portion 26, extending on the interface portion 25.

The interface portion 25 is of a compound including carbon, for example a compound including titanium and carbon or carbon and tantalum.

In detail, the interface portion 25 may be of a metal carbide, for example of titanium carbide (TiC) or of tantalum carbide (TaC).

The interface portion 25 extends on the first surface 5A of the semiconductor body 5, in direct electrical contact with the barrier layer 11, and has a thickness along the third axis Z for example between 1 nm and 10 nm, in particular between 1 nm and 5 nm.

The interface portion 25 forms an ohmic contact between the source region 15 and the heterostructure 8.

The central body portion 26 is formed by a stack of metal layers including, in this embodiment, a first central layer 26A of a material chosen from titanium or tantalum and extending on the interface portion 25; a second central layer 26B of metal, for example of aluminum, and extending on the first central layer 26A; and a third central layer 26C, for example of titanium, tantalum, tungsten, titanium nitride, etc., extending on the second central layer 26B and forming here the top surface 28.

The second central layer 26B has a thickness along the third axis Z, for example, between 10 nm and 300 nm, and functions as a filling body of the source region 15.

The third central layer 26C serves as encapsulation or protective layer of the source region 15.

However, the central body portion 26 may be formed by a different number of layers, depending on the specific application. For example, the third central layer 26C may be absent.

Additionally or alternatively, the first central layer 26A may be absent, as discussed hereinafter with reference to the manufacturing process of the source region 15.

In practice, according to an embodiment, the second central layer 26B may extend directly on the interface portion 25.

According to a different embodiment, the central body portion 26 may be formed by the second filling layer 26B only.

The interface portion 25 of the source region 15, rich in carbon, forms an ohmic contact with the heterostructure 8 having a low contact resistance, in particular lower than would be obtained if the interface portion 25 was carbon-free.

As discussed hereinafter with reference to the manufacturing process of the source region 25, such ohmic contact may be formed by a low-temperature annealing, for example below 550° C., in particular at a temperature between 400° C. and 500° C.

Moreover, the top surface 28 of the source region 15 has a low surface roughness, lower than that of the ohmic contacts of the known HEMT devices.

Consequently, the HEMT device 1 has optimum electrical performances and a low probability of malfunctions or failures.

Hereinafter, with reference to FIGS. 3-7, manufacturing steps of the HEMT device 1 are described, in particular the manufacturing steps leading to the formation of the source region 15.

It will be clear to the person skilled in the art that the manufacturing steps described with reference to FIGS. 3-7 for the formation of the source region 15 also apply to the formation of the drain region 16. For example, the drain region 16 may be formed at the same time as the source region 15.

Moreover, FIGS. 3-7 do not illustrate steps (contextual, previous and/or subsequent steps) for the formation of the gate region 18, electrical contact metallizations, generic electrical connections, and any other element, known per se and not shown here, useful or necessary for the operation of the HEMT device 1.

Figure 3:
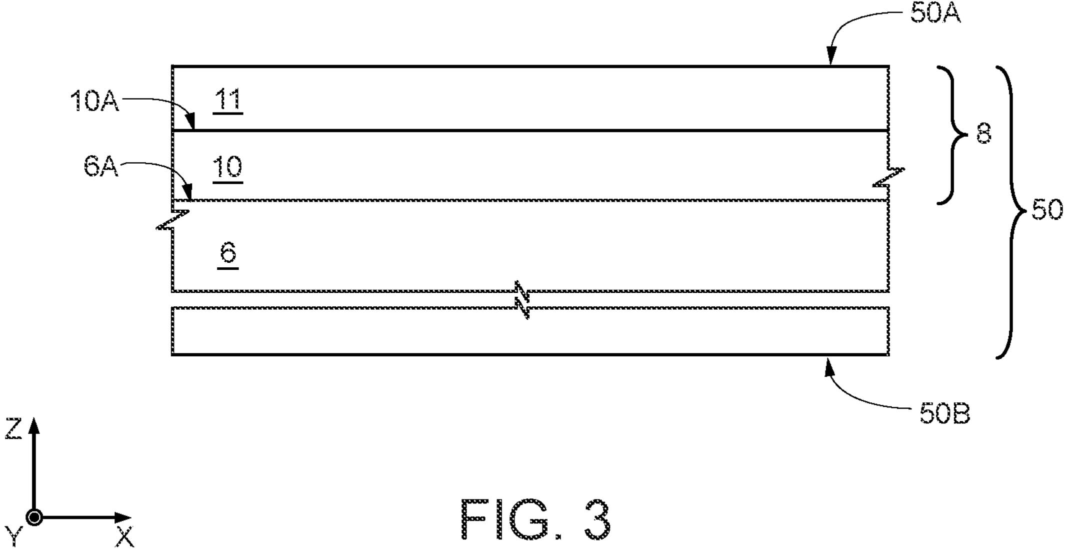
FIGS. 3-7 show cross-sections of the portion of the HEMT device of FIG. 2, in subsequent manufacturing steps, according to an embodiment.

FIG. 3 shows a cross-section of a work body 50 having a first surface 50A and a second surface 50B. Elements of the work body 50 common to what has already been described with reference to FIGS. 1 and 2, are indicated with the same reference numbers and are not further described in detail.

In the work body 50, the substrate 6 and the heterostructure 8 including the channel layer 10 and the barrier layer 11 have already been formed. The heterostructure 8, in particular herein the barrier layer 11, forms the first surface 50A of the work body 50.

Figure 4:
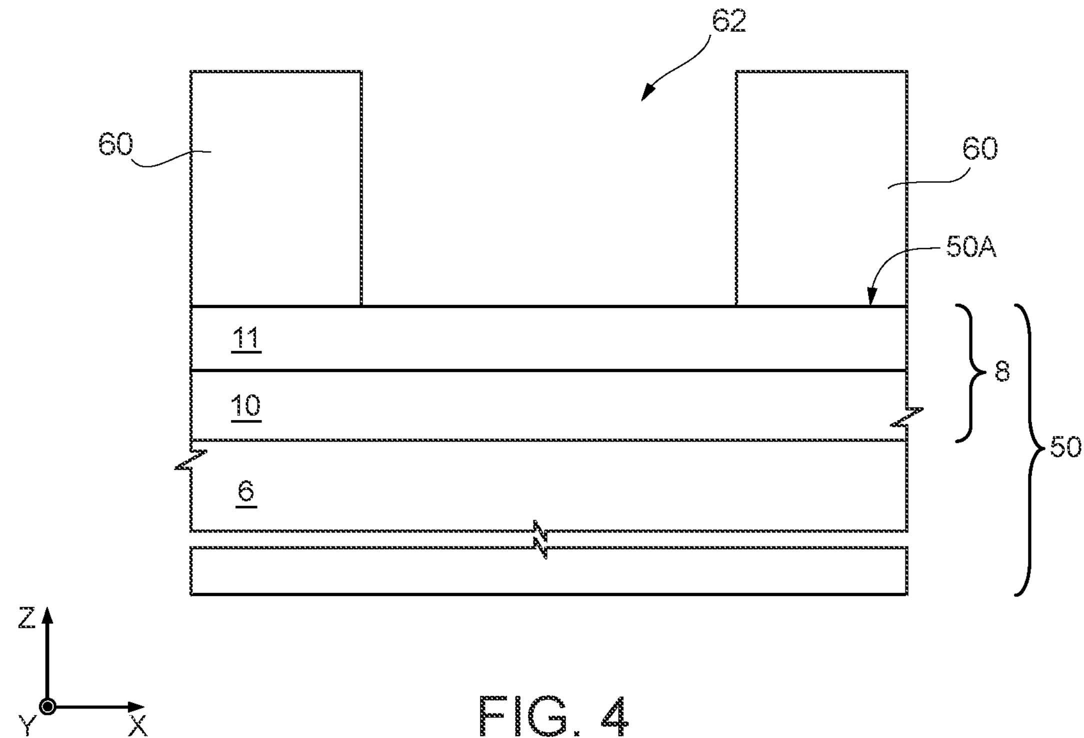

Subsequently, FIG. 4, a mask 60 having a window 62 is formed on the first surface 50A of the work body 50.

The mask 60 may be formed through known lithography and etching steps; for example, the mask 60 may be formed by a photoresist of a positive, negative or bilayer type.

The window 62 extends throughout the thickness, along the third axis Z, of the mask 60 and leaves exposed a portion of the first surface 50A of the work body 50, where it is desired to form the source region 15.

Figure 5:
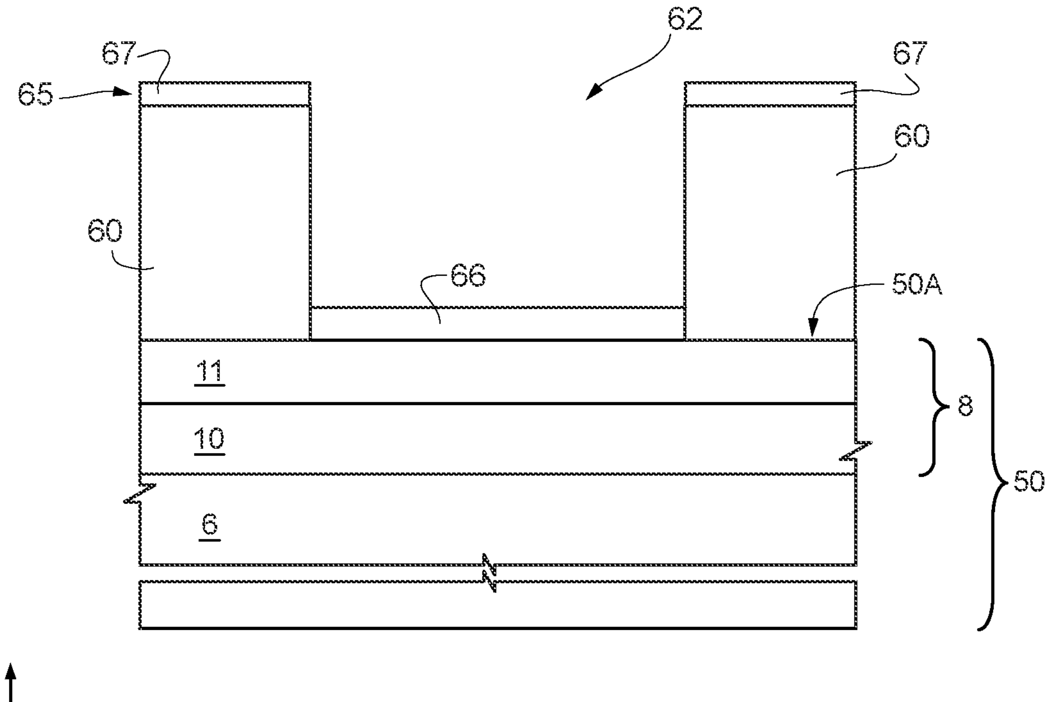

With reference to FIG. 5, a work interface layer 65, of carbon, is formed on the work body 50, for example through evaporation, sputtering, chemical vapor deposition (CVD), etc.

The work interface layer 65 has a thickness, along the third axis Z, for example between 1 nm and 10 nm.

The work interface layer 65 includes a reaction portion 66, extending inside the window 62, i.e., on the exposed portion of the first surface 50A of the work body 50, and a spurious portion 67 extending above the mask 60.

Subsequently, FIG. 6, a metal work stack 70 is formed on the work interface layer 65, for example through evaporation, sputtering, chemical vapor deposition (CVD), etc.

The metal work stack 70 includes a reaction layer 70A, chosen between titanium and tantalum, extending directly on the work interface layer 65.

The reaction layer 70A has a thickness along the third axis Z for example between 2 nm and 10 nm.

In this embodiment, the metal work stack 70 also includes a filling layer 70B, for example of aluminum, extending on the reaction layer 70A, and a protection layer 70C, for example of titanium, tantalum, tungsten, etc., extending on the filling layer 70B.

The filling layer 70B has a thickness for example between 10 nm and 300 nm.

The metal work stack 70 is formed both inside the window 62, i.e., on the reaction portion 66 of the work interface layer 65, and above the mask 60.

Figures 6, 7:
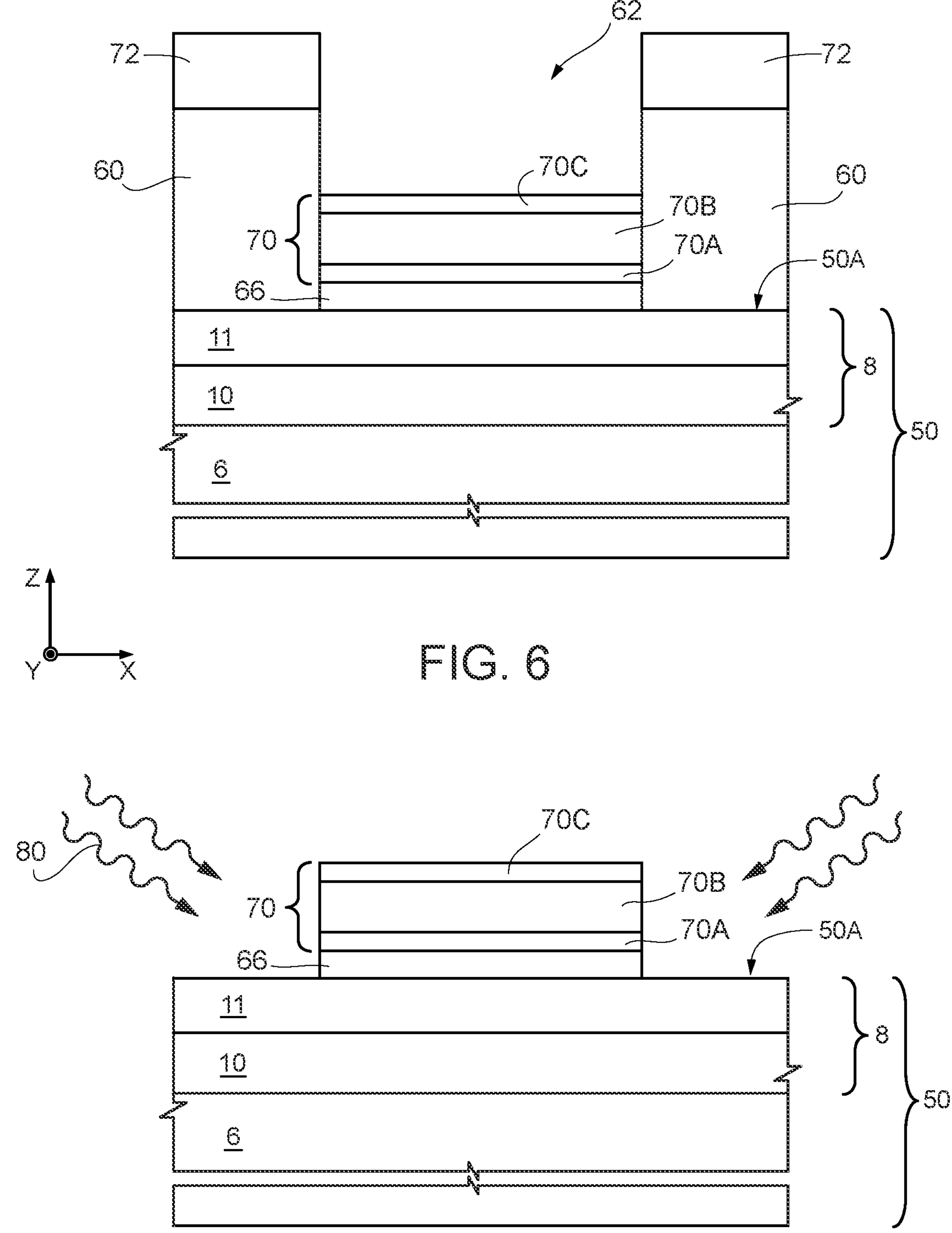

The portion of the metal work stack 70 deposited on the mask 60 overlies the spurious portion 67 of the work interface layer 65, forming a spurious deposition, indicated as a whole by 72 in FIG. 6.

The mask 60 is then removed by a lift-off process of a per se known type. Together with the mask 60, the spurious deposition 72 is also removed.

Then, FIG. 7, the work body 50 is subject to an annealing, schematically represented by arrows 80 in FIG. 7.

The annealing may be performed at a temperature, for example, between 400° C. and 600° C., in particular lower than or equal to 550° C., in a protected environment (for example in a nitrogen or argon atmosphere).

The annealing may be a rapid thermal annealing (RTA) or a different annealing, of a per se known type.

During the annealing, the reaction portion 66 of the work interface layer 65, of carbon, reacts with the reaction layer 70A, of titanium or tantalum, thus forming the interface portion 25 of the source region 15 of FIGS. 1 and 2.

Depending on the thickness of the reaction portion 66, on the thickness of the reaction layer 70A and on the duration of the annealing, the reaction layer 70A may only partially react with the reaction portion 66; the remaining portion of the reaction layer 70A forms the first central layer 26A shown in FIG. 2.

However, the reaction layer 70A may completely react with the reaction portion 66 of the work interface layer 65; in this case, in the HEMT device 1 of FIGS. 1 and 2, the second central layer 26B (corresponding to the filling layer 70B) extends directly onto the interface portion 25.

Following further manufacturing steps of a per se known type, for example formation of the gate region 18, dicing of the work body 50 and formation of electrical connections, the HEMT device 1 is formed.

The presence of the work interface layer 65 allows the formation of an ohmic contact with the heterostructure 8 already at low temperatures, for example at a temperature of 550° C. or even lower.

Such a low temperature allows a low roughness of the top surface 28 of the source region 15 to be obtained. For example, the roughness of the top surface 28 of the source region 15 may have a root mean square (RMS) value, measured with an atomic force microscope (AFM), of about 10 nm.

Figure 8:
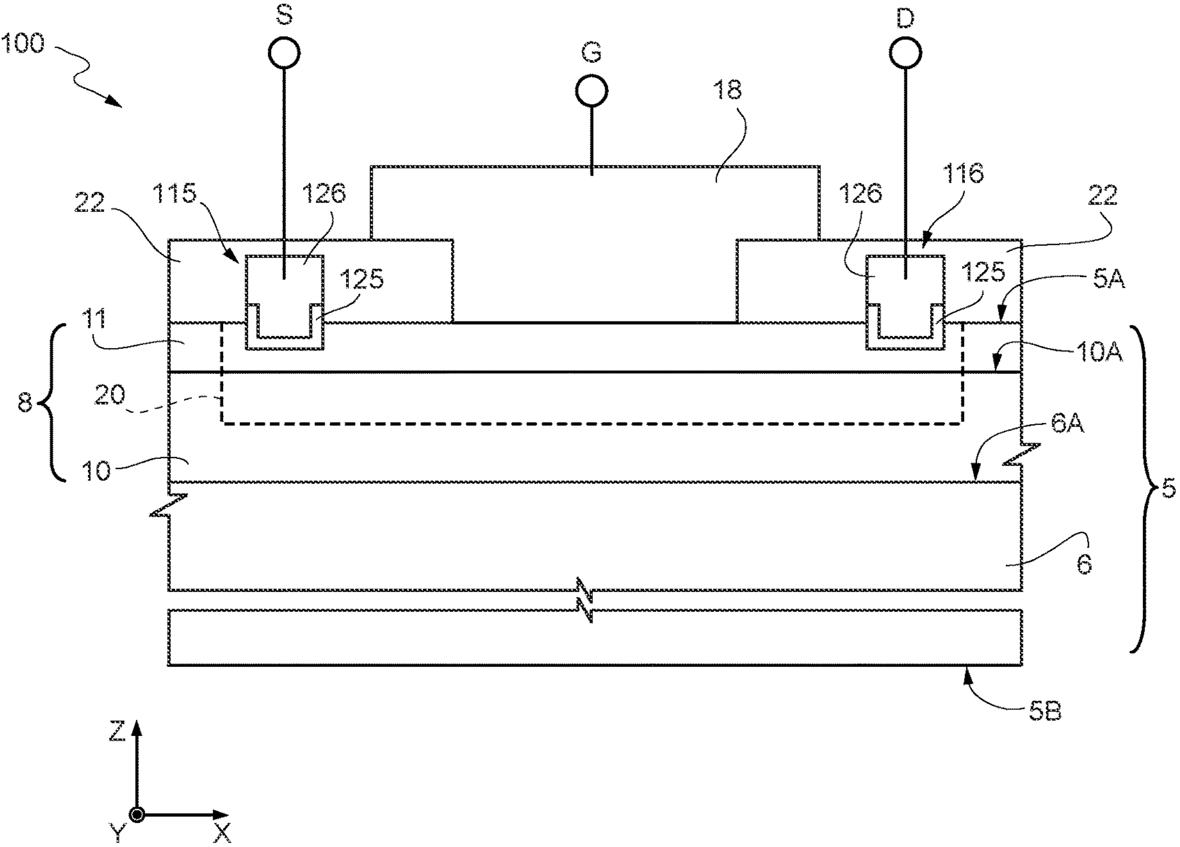
FIG. 8 shows a cross-section of the present HEMT device, according to a different embodiment, according to an embodiment.

FIG. 8 shows a different embodiment of the present HEMT device, here indicated by 100. The HEMT device 100 has a general structure similar to that of the HEMT device 1 of FIG. 1; consequently, elements in common are indicated by the same reference numbers and are not further described.

The HEMT device 100 is formed in the body 5 having the first surface 5A and the second surface 5B and including the substrate 6 and the heterostructure 8. The heterostructure 8 here again includes the channel layer 10 and the barrier layer 11 and accommodates the active region 20.

The HEMT device 100 further includes a source region, here indicated by 115, a drain region, here indicated by 116, and the gate region 18 extending, along the first axis X, between the source region 115 and the drain region 116.

The gate region 18 extends through the insulation layer 22, throughout its thickness along the third axis Z, up to the first surface 5A of the body 5.

In this embodiment, the source region 115 and the drain region 116 are of a recessed type and extend, from the first surface 5A of the body 5, partially inside the heterostructure 8, in ohmic contact with the heterostructure 8, in particular with the conductive channel accommodated in the active region 20.

Also in this embodiment, the source region 115 and the drain region 116 form, respectively, a source electrode S and a drain electrode D of the HEMT device 100. Moreover, the source region 115 and the drain region 116 are equal to each other; consequently, hereinafter, reference will be made for simplicity to the source region 115 only and what has been described for the source region 115 also applies to the drain region 116, unless otherwise specified.

However, it will be clear to the person skilled in the art that the source region 115 and the drain region 116 may be different from each other, for example formed by different materials or have different shapes and dimensions, depending on the specific application.

Figure 9:
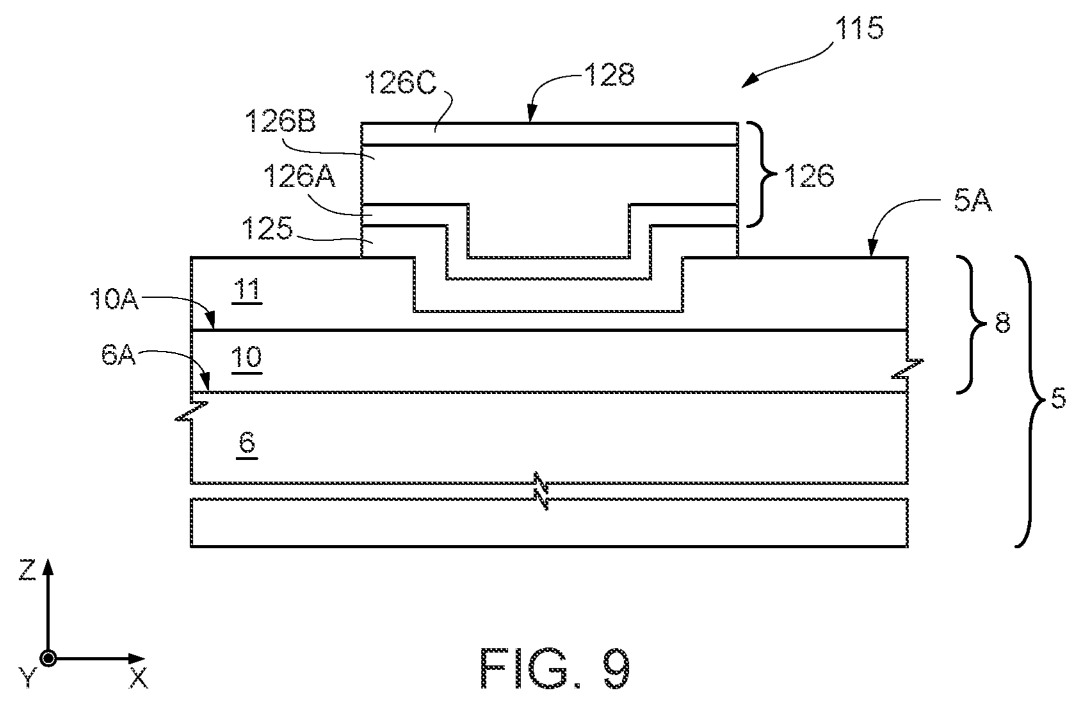
FIG. 9 shows a cross-section of a portion of the HEMT device of FIG. 8, according to an embodiment.

As shown in detail in FIG. 9, the source region 115 extends through the barrier layer 11 and ends in the barrier layer 11.

According to an embodiment, not shown here, the source region 115 may extend throughout the thickness of the barrier layer 11, up to the surface 10A of the channel layer 10.

According to a further embodiment, not shown here, the source region 115 may extend throughout the thickness, along the third axis Z, of the barrier layer 11 and partially through the thickness, along the third axis Z, of the channel layer 10. In other words, the source region 115 may end in the channel layer 10.

The source region 115 is also formed here by an interface portion, indicated by 125, which extends in direct contact with the heterostructure 8, and a central body portion, indicated by 126, which extends on the interface portion 125.

The interface portion 125 is also here of a compound including carbon, for example a compound including titanium and carbon or carbon and tantalum.

In detail, the interface portion 125 may be of a metal carbide, for example of titanium carbide (TiC) or of tantalum carbide (TaC).

The central body portion 126 is also formed here by a first central layer 126A, of titanium or tantalum; by a second central layer 126B of metal, for example aluminum; and by a third central layer 126C, for example of titanium, tantalum, tungsten, titanium nitride, etc.

Further details described with reference to the interface portion 25 and the central body portion 26 of the HEMT device 1 also apply to the interface portion 125 and, respectively, to the central body portion 126 of the HEMT device 100. The interface portion 125 and the central body portion 126 are therefore not further described in detail herein.

Hereinafter, with reference to FIGS. 10-17, manufacturing steps of the HEMT device 100 are described, in particular the manufacturing steps leading to the formation of the source region 115.

It will be clear to the person skilled in the art that the manufacturing steps described with reference to FIGS. 10-17 for the formation of the source region 115 also apply to the formation of the drain region 116. For example, the drain region 116 may be formed at the same time as the source region 115.

Moreover, FIGS. 10-17 do not illustrate steps (contextual, previous and/or subsequent steps) for the formation of the gate region 18, electrical contact metallizations, generic electrical connections, and any other element, known per se and not shown here, useful or necessary for the operation of the HEMT device 100.

Figure 10:
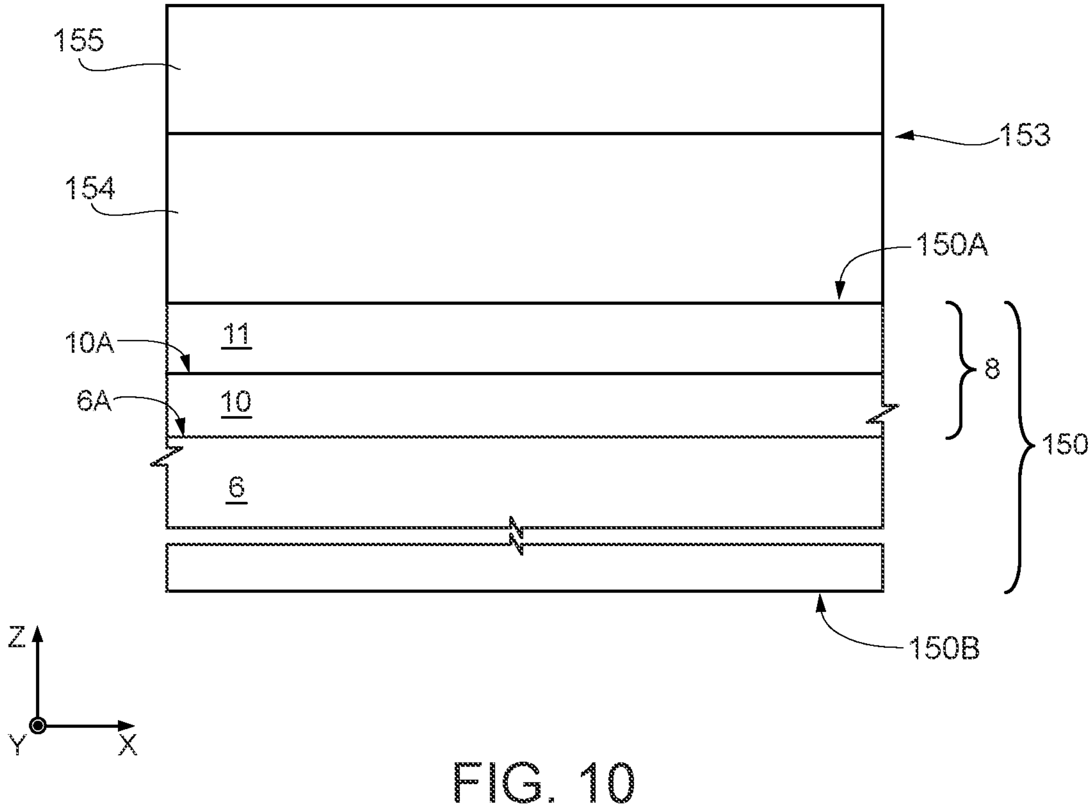
FIGS. 10-17 show cross-sections of the portion of the HEMT device of FIG. 9, in subsequent manufacturing steps, according to an embodiment.

FIG. 10 shows a cross-section of a work body 150 having a first surface 150A and a second surface 150B. Elements of the work body 150 common to what has already been described with reference to FIGS. 8 and 9 are indicated with the same reference numbers and are not further described in detail.

In the work body 150 the substrate 6 and the heterostructure 8 including the channel layer 10 and the barrier layer 11 have already been formed. The heterostructure 8, in particular herein the barrier layer 11, forms the first surface 150A of the work body 150.

Moreover, a stack of sacrificial layers 153 has been formed on the first surface 150A, intended to form a mask for the formation of the source region 115, including a first sacrificial layer 154 and a second sacrificial layer 155.

The first sacrificial layer 154 is of a non-photosensitive material, for example a solution of a non-photosensitive organic polymer, having a thickness along the third axis Z chosen as a function of the thickness of metal that needs to be deposited. The first sacrificial layer 154 extends on the first surface 150A of the work body 150.

The second sacrificial layer 155 is of photosensitive material, for example a photoresist, and extends on the first sacrificial layer 154.

The first and the second sacrificial layers 154, 155 may be deposited through a spin-coating technique.

Subsequently, FIG. 11, the second sacrificial layer 155 is patterned, through known lithography and development steps, so as to selectively remove portions of the second sacrificial layer 155 and form a window 157 at the region of the work body 150 where it is intended to form the source region 115.

Since the first sacrificial layer 154 is not photosensitive, the lithography step of the second sacrificial layer 155 has no effect on the first sacrificial layer 154. At the end of the development of the second sacrificial layer 155, the first sacrificial layer 154 is partially exposed at the window 157. During this step, the isotropic etching of the first sacrificial layer 154 also occurs, to uniformly remove the regions of the first sacrificial layer 154 exposed by the window 157. Since the etching is of isotropic type, portions of the first sacrificial layer 154 are also removed below the second sacrificial layer 155. In practice, an underetch or undercut phenomenon is observed and undercut regions 159 are thus formed extending under the second sacrificial layer 155, on the sides, along the first axis X, of the window 157.

The removal of the first sacrificial layer 154 proceeds up to the first surface 150A of the work body 150.

Figures 11, 12:
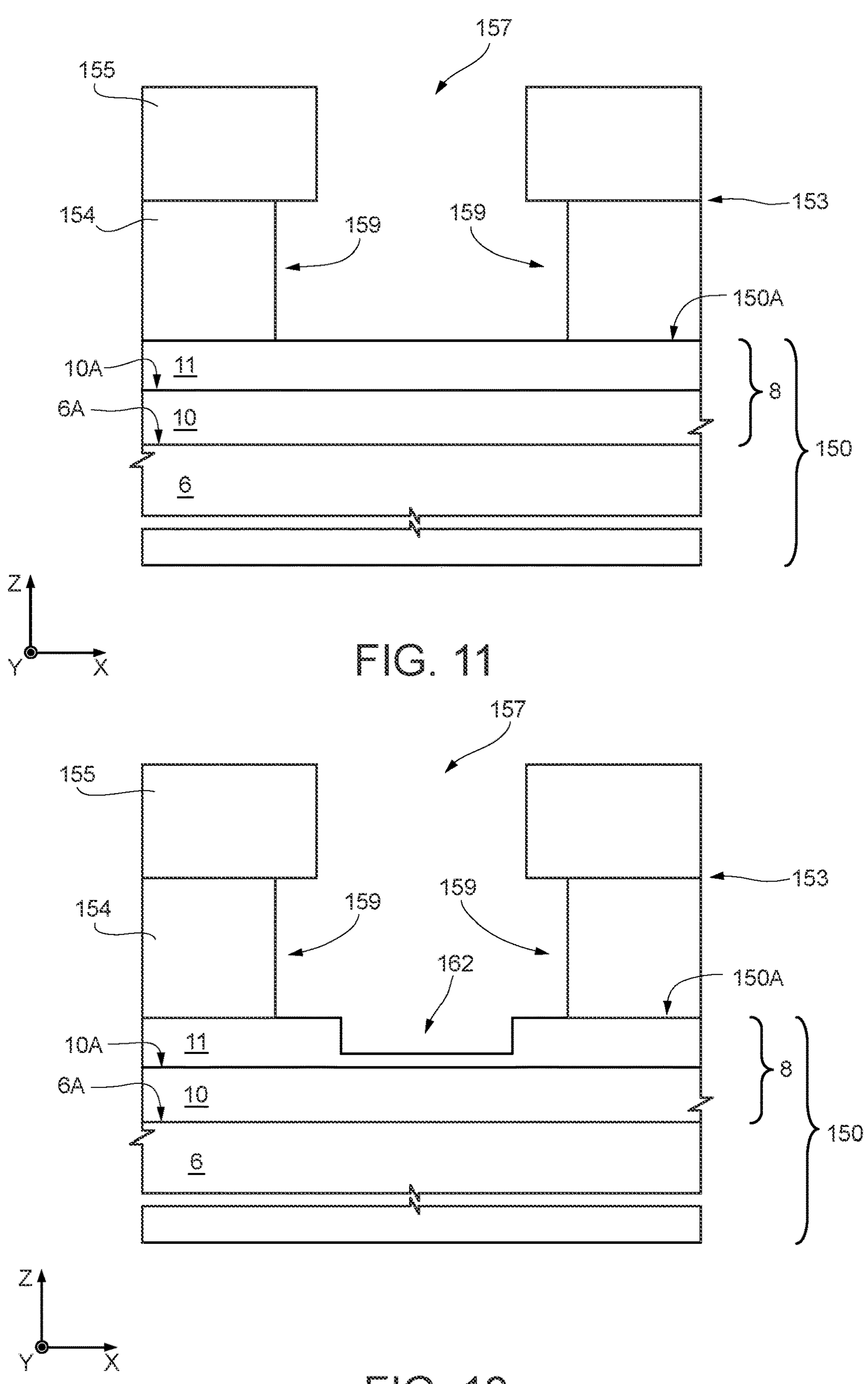

Then, FIG. 12, a recess 162 is formed in the heterostructure 8, at the window 157, for example through etching.

In this embodiment, the recess 162 extends from the first surface 150A within the barrier layer 11 and ends in the barrier layer 11.

Figure 13:
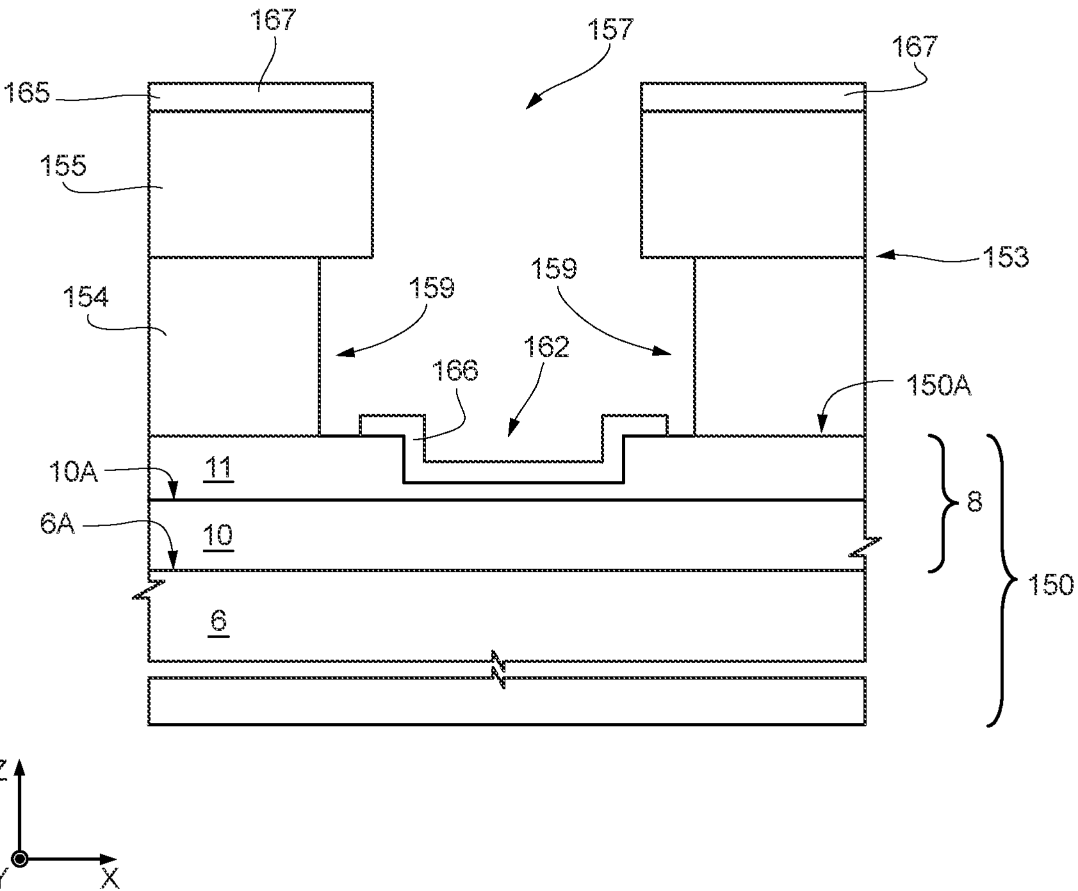

Subsequently, FIG. 13, a work interface layer 165 of carbon is formed on the work body 150, for example through evaporation, sputtering, or chemical vapor deposition (CVD), using the stack of sacrificial layers 153 as a mask. The work interface layer 165 includes a reaction portion 166, extending into the recess 162 in direct contact with the barrier layer 11, and a spurious portion 167 extending on the second sacrificial layer 155.

The work interface layer 165 has a thickness for example between 1 nm and 10 nm.

In this embodiment, the reaction portion 166 of the work interface layer 165 partially extends also on the first surface 150A of the work body 150, on the sides of the recess 162. In practice, the reaction portion 166 is a continuous portion, conformal to the walls of the barrier layer 11 which form the recess 162.

Figure 14:
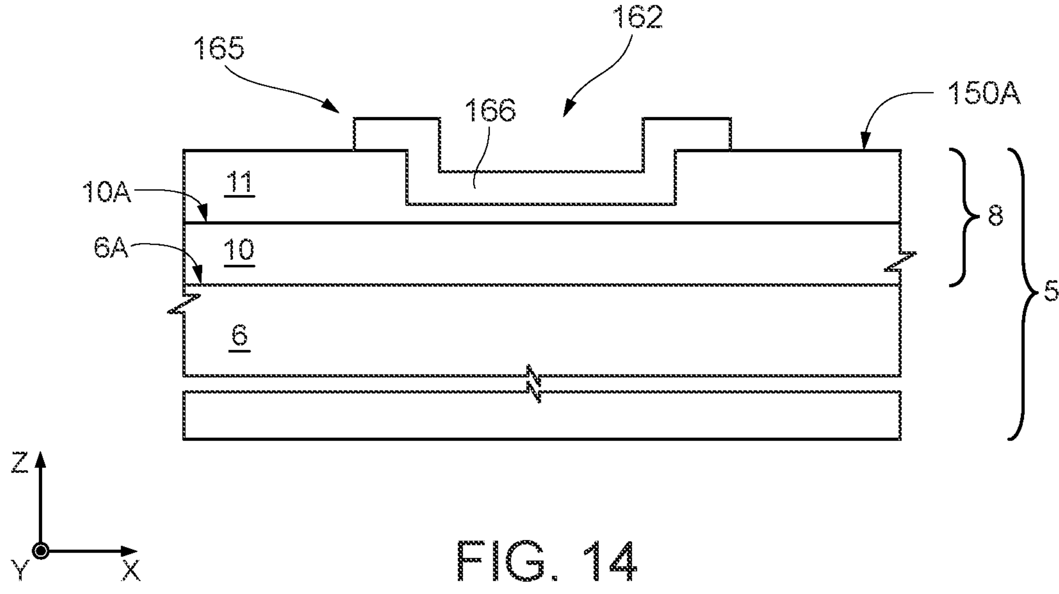

Then, FIG. 14, a lift-off process of a per se known type is performed, whereby the first and the second sacrificial layers 154, 155 are removed. Simultaneously, the spurious portion 167 of the work interface layer 165 is also removed.

Figure 15:
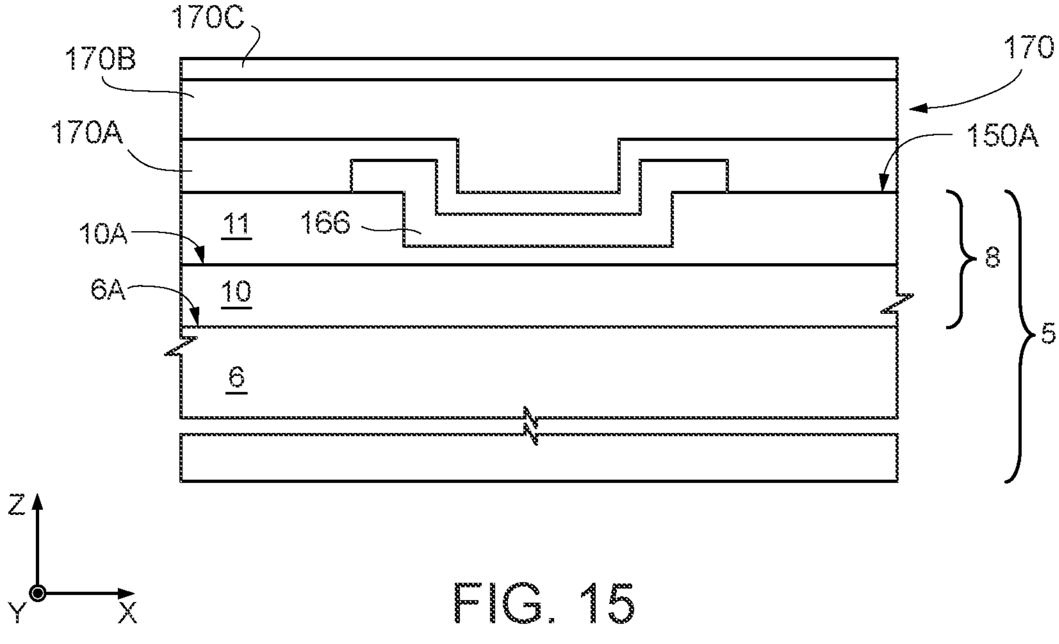

A metal work stack, here indicated by 170, is then formed, FIG. 15, on the work body 105, through a blanket-type deposition process. In practice, the metal work stack 170 is formed both on the first surface 150A of the work body 150 and on the reaction portion 166 of the work interface layer 165.

The metal work stack 170 includes a reaction layer 170A, of titanium or tantalum, extending on the reaction portion 166 of the work interface layer 165.

The reaction layer 170A has a thickness, for example, between 2 nm and 10 nm.

In this embodiment, the metal work stack 170 also includes a filling layer 170B, for example of aluminum, extending on the reaction layer 170A, and a protection layer 170C, for example of titanium, tantalum, tungsten, etc., extending on the filling layer 170B.

The filling layer 170B has a thickness for example between 10 nm and 300 nm.

Figure 16:
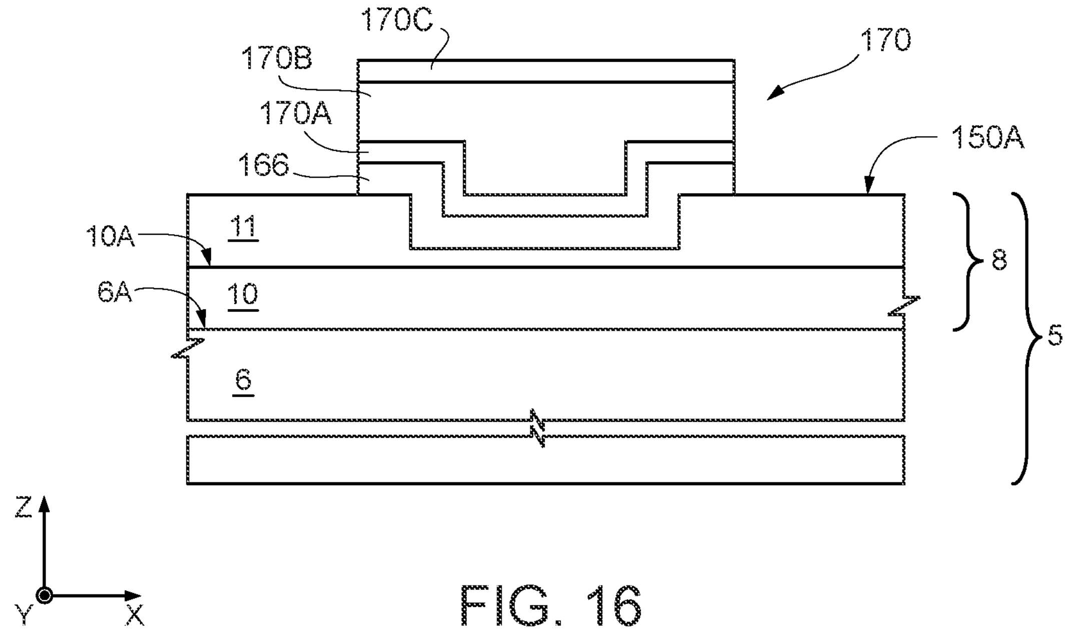

With reference to FIG. 16, through selective etching steps, portions of the metal work stack 170, extending outside the region where the source region 115 is intended to be formed, are selectively removed.

In practice, of the stack of metal layers 170, only a body portion remains, which extends on the reaction portion 166 of the work interface layer 165.

Figure 17:
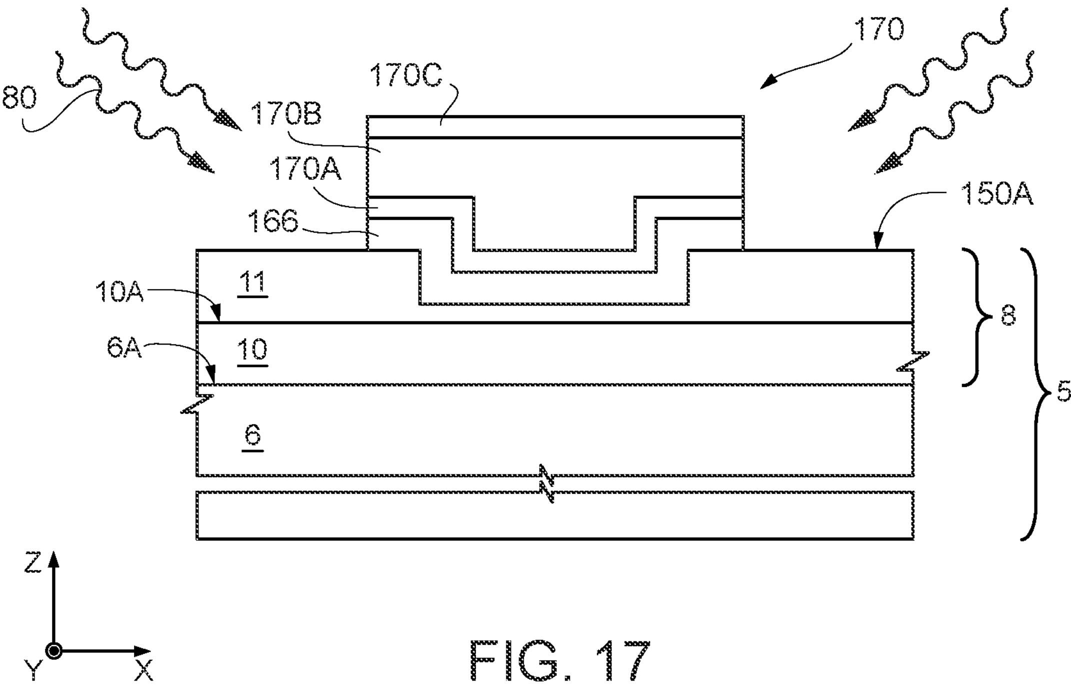

Subsequently, FIG. 17, the work body 150 is subject to an annealing, similarly to what has been discussed with reference to FIG. 7 and therefore not further discussed in detail herein.

Following the annealing, the reaction portion 166 of the work interface layer 165 reacts with the reaction layer 170A, forming the interface portion 125 of the source region 115 of FIGS. 8 and 9.

Following further manufacturing steps of a per se known type, for example formation of the gate region 18, dicing of the work body 150 and formation of electrical connections, the HEMT device 100 is formed.

The use of the stack of sacrificial layers 153, in particular the presence of the undercut regions 159, allows the reliability of the lift-off step and therefore the reliability of the manufacturing process of the HEMT device 100 to be improved.

Finally, it is clear that modifications and variations may be made to the HEMT devices 1, 100 and to the related manufacturing processes described and illustrated herein without thereby departing from the scope of the present disclosure, as defined in the attached claims.

For example, the channel layer 10 and the barrier layer 11 may each be formed by a plurality of layers overlapping on each other, for example one or more layers of GaN, or GaN-based alloys, suitably doped or of intrinsic type, depending on the specific application.

With reference to the HEMT device 1, the source region 15, the drain region 16 and the gate region 18 may extend along the second axis Y according to different shapes and configurations, depending on the specific application, in a manner per se known and therefore not discussed in detail. For example, in top-plan view, not shown here, the source region 15, the drain region 16 and the gate region 18 may have a shape of elongated strips along the second axis Y, or may have a circular shape or any other shape, regular or non-regular.

For example, the source region 15, the drain region 16 and the gate region 18 may each form a portion of a respective region having a more complex shape and electrically connected to other portions through specific electrical connections.

Similar considerations also apply to shape and configuration of the source region 115, the drain region 116 and the gate region 18 of the HEMT device 100.

The embodiments shown may be combined to form further solutions.

In one embodiment, a manufacturing process of a HEMT device, from a work body including a semiconductive heterostructure, may be summarized as including forming a conductive region having an interface portion in ohmic contact with the semiconductive heterostructure. Forming a conductive region includes forming a first reaction region including carbon on the semiconductive heterostructure, forming a metal stack including a second reaction region extending in contact with the first reaction region, and annealing the work body, so that the first reaction region reacts with the second reaction region, thus forming the interface portion of the conductive region, the interface portion being of a compound including carbon.

The second reaction region may be of titanium or tantalum.

The first reaction region may have a thickness between 1 nm and 10 nm.

Annealing the work body may be performed at a temperature between 400° C. and 550° C.

Forming a conductive region may further include forming a recess in the semiconductive heterostructure, the first reaction region being formed in the recess.

The semiconductive heterostructure having a surface, wherein forming a first reaction region may include forming a mask on the surface of the semiconductive heterostructure; depositing an interface layer including carbon on the surface of the semiconductive heterostructure; and performing a lift-off process of the mask.

Forming a metal stack may include depositing the second reaction region on the first reaction region; and depositing a filling region on the second reaction region.

The filling region may be of aluminum.

In one embodiment, a HEMT device may be summarized as including a semiconductive heterostructure and a conductive region in ohmic contact with the semiconductive heterostructure. The conductive region includes an interface portion including carbon and extending in direct contact with the semiconductive heterostructure.

The interface portion of the conductive region may be of a metal carbide.

The interface portion of the conductive region may be a compound including carbon and titanium or a compound including carbon and tantalum.

The conductive region may further include a central body portion including at least one metal layer extending on the interface portion.

The at least one metal layer may be an aluminum layer.

The conductive region may be of recessed-type and partially extends inside the semiconductive heterostructure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing process of a HEMT device, the process comprising:

forming, from a work body including a semiconductive heterostructure, a conductive region having an interface portion in ohmic contact with the semiconductive heterostructure, wherein forming the conductive region includes:

forming a first reaction region including carbon in a barrier layer of the semiconductive heterostructure, the first reaction region having a thickness between 1 nm and 10 nm;

forming a metal stack including a second reaction region extending in contact with the first reaction region; and forming the interface portion of the conductive region by reacting the first reaction region with the second reaction region by annealing the work body, the interface portion being of a compound including carbon; and forming an insulating layer on a first surface of the semiconductive heterostructure and the conductive region, the conductive region being recessed from and extending transverse to the first surface of the semiconductive heterostructure.

2. The manufacturing process according to claim 1, wherein the second reaction region is of titanium or tantalum.

3. The manufacturing process according to claim 1, wherein annealing the work body is performed at a temperature between 400° C. and 550° C.

4. The manufacturing process according to claim 1, wherein forming the conductive region further includes forming a recess in the barrier layer of the semiconductive heterostructure, the first reaction region being formed in the recess.

5. The manufacturing process according to claim 1, the barrier layer having a surface, wherein forming the first reaction region includes:

forming a mask on the surface of the barrier layer;

depositing a layer of carbon on the surface of the barrier layer; and performing a lift-off process of the mask.

6. The manufacturing process according to claim 1, wherein forming the metal stack includes:

depositing the second reaction region on the first reaction region; and depositing a filling region on the second reaction region.

7. The manufacturing process according to claim 6, wherein the filling region is of aluminum.

8. A HEMT device, comprising:

a semiconductive heterostructure including:

a channel layer; and a barrier layer on the channel layer, the barrier layer having a first surface extending along a first direction and a recess in the first surface;

an insulating layer on the first surface of the barrier layer;

a source or drain region in the recess of the barrier layer and the insulating layer, the source or drain region being recessed from the first surface of the barrier layer and including a conductive region in ohmic contact with the semiconductive heterostructure, the source or drain region extending along a second direction transverse to the first direction between the barrier layer and the insulating layer, wherein the conductive region includes:

an interface portion including carbon and extending in direct contact with the semiconductive heterostructure, the interface portion having a first portion, a second portion, and a third portion, the first portion extending along a bottom of the recess, the second and third portions extending along the second direction so that the second portion is opposite the third portion, the second and third portions being transverse to the first surface of the barrier layer, the interface portion having a thickness between 1 nm and 10 nm; and a stack of metal layers on the interface portion and in the recess of the barrier layer; and a gate region on the barrier layer.

9. The HEMT device according to claim 8, wherein the interface portion of the conductive region is of a metal carbide.

10. The HEMT device according to claim 8, wherein the interface portion of the conductive region is a compound including carbon and titanium or a compound including carbon and tantalum.

11. The HEMT device according to claim 8, wherein the stack of metal layers includes a central body portion extending on the interface portion.

12. The HEMT device according to claim 11, wherein the central body portion is an aluminum layer.

13. The HEMT device according to claim 8, wherein the conductive region partially extends inside a recess in the barrier layer.

14. A process for forming a HEMT device, the process comprising:

forming a semiconductor heterostructure including a channel layer and a barrier layer on the channel layer; and forming a source or drain region on the semiconductor heterostructure, the source or drain region being recessed from a first surface of the semiconductor heterostructure, wherein forming the source or drain region includes:

depositing a layer of carbon in the barrier layer that extends transverse to the first surface of the semiconductor heterostructure by:

forming a mask layer on the barrier layer;

patterning the mask layer to expose a portion of the barrier layer;

forming a trench in the barrier layer and terminating within the barrier layer;

depositing the layer of carbon on the mask layer and on the barrier layer in the trench; and performing a liftoff process including removing the mask layer and a first portion of the layer of carbon on the mask layer;

depositing a first metal layer in contact with the layer of carbon;

depositing a second metal layer in contact with the first metal layer, the second metal layer being on a second portion of the layer of carbon within the trench after performing the liftoff process; and forming a metal carbide layer from the layer of carbon and the first metal layer by performing a thermal annealing process; and forming an insulating layer on the semiconductor heterostructure and the source or drain region.

15. The process of claim 14, wherein forming the source or drain region includes:

depositing a third metal layer in contact with the second metal layer; and performing the thermal annealing process after depositing the third metal layer.

16. The process of claim 14, wherein the thermal annealing process has a maximum temperature less than or equal to 550° C.

17. The process of claim 14, wherein the layer of carbon has a thickness between 1 nm and 10 nm.

18. The process of claim 14, wherein the second portion of the layer of carbon partially extends on the semiconductor heterostructure.

19. The process of claim 14, wherein the second portion of the layer of carbon is a continuous portion, conformal to walls of the trench.

20. The process of claim 14, the first metal layer having a thickness between 2 nm and 10 nm.

* * * * *